United States Patent
Jia et al.

(10) Patent No.: US 8,864,915 B2
(45) Date of Patent: Oct. 21, 2014

(54) CLEANING METHODS FOR IMPROVED PHOTOVOLTAIC MODULE EFFICIENCY

(75) Inventors: Renhe Jia, Berkeley, CA (US); Adam Brand, Palo Alto, CA (US); Liming Zhang, San Jose, CA (US); Dapeng Wang, Santa Clara, CA (US); Tzay-Fa Su, San Jose, CA (US); Vijay Parihar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 611 days.

(21) Appl. No.: 13/197,614

(22) Filed: Aug. 3, 2011

(65) Prior Publication Data

US 2012/0037181 A1 Feb. 16, 2012

Related U.S. Application Data

(60) Provisional application No. 61/373,540, filed on Aug. 13, 2010.

(51) Int. Cl.
| | |
|---|---|
| *B08B 3/00* | (2006.01) |
| *B08B 3/12* | (2006.01) |
| *H01L 31/18* | (2006.01) |
| *B23K 26/16* | (2006.01) |
| *H01L 31/0392* | (2006.01) |
| *B23K 26/36* | (2014.01) |
| *B08B 3/08* | (2006.01) |

(52) U.S. Cl.
CPC ... *B08B 3/08* (2013.01); *B08B 3/12* (2013.01); *H01L 31/18* (2013.01); *Y02E 10/50* (2013.01); *B23K 26/16* (2013.01); *H01L 31/0392* (2013.01); *B23K 26/367* (2013.01)
USPC ............ 134/26; 134/1; 134/2; 134/3; 134/27; 134/28

(58) Field of Classification Search
None
See application file for complete search history.

(56) References Cited

U.S. PATENT DOCUMENTS

| | | | |
|---|---|---|---|
| 7,608,308 B2 | 10/2009 | Liu et al. | |
| 2005/0235869 A1* | 10/2005 | Cruchon-Dupeyrat et al. | 106/31.29 |
| 2006/0219294 A1* | 10/2006 | Yabuuchi et al. | 136/263 |
| 2011/0108118 A1 | 5/2011 | Yamarin et al. | |

\* cited by examiner

*Primary Examiner* — Eric Golightly
(74) *Attorney, Agent, or Firm* — Patterson & Sheridan, LLP

(57) ABSTRACT

A method of processing a substrate having a transparent conductive oxide disposed thereon, including: exposing the substrate to a first cleaning solution comprising hydrogen peroxide and ammonium citrate; exposing the substrate to a second cleaning solution having a pH within a range from about 6 to about 7, the second cleaning solution different than the first cleaning solution; agitating the second cleaning solution; and depositing a silicon-containing film on the transparent conductive oxide.

8 Claims, 2 Drawing Sheets

CLEANING METHODS FOR IMPROVED PHOTOVOLTAIC MODULE EFFICIENCY

CROSS-REFERENCE TO RELATED APPLICATIONS

This application claims benefit of U.S. Provisional Patent Application Ser. No. 61/373,540, filed Aug. 13, 2010, which is herein incorporated by reference.

BACKGROUND OF THE INVENTION

1. Field of the Invention

Embodiments of the present invention generally relate to methods of cleaning substrate surfaces.

2. Description of the Related Art

In the production of photovoltaic cells and modules, such as amorphous silicon and microcrystalline solar cells, the efficiency of the individual cells can be an important industrial concern. One factor that may affect the efficiency of the photovoltaic cells is foreign matter or contaminants present during film processing. Contaminants present on the surface of the cell prior to or during film processing can reduce the overall conversion efficiency of the solar cell, and may lead to the formation of hot spots in assembled photovoltaic modules. Hot spots may occur when one of the photovoltaic cells in a photovoltaic module are electrically mismatched compared to the rest of the cells in the photovoltaic module. The presence of hot spots generates localized heat which may lead to device failure. However, improving the efficiency of each photovoltaic cell reduces the electrical mismatch between photovoltaic cells, thus reducing the occurrence of hot spots.

Therefore, there is a need for improved methods of manufacturing photovoltaic cells and modules with reduced contamination and higher conversation efficiency.

SUMMARY OF THE INVENTION

Embodiments of the present invention generally relate to methods for cleaning a substrate prior to a deposition process. The methods generally include exposing a substrate to multiple cleaning solutions to remove contaminants from a surface of a substrate. The multiple solutions generally have different compositions, and each of the solutions contain one or more additives selected to remove a variety of contaminants. Mechanical agitation may also be utilized to remove contaminants from the surface of a substrate. After cleaning a substrate, a material may be deposited on the substrate surface.

In one embodiment, a method of processing a substrate having a transparent conductive oxide (TCO) disposed thereon includes exposing the substrate to a first cleaning solution comprising hydrogen peroxide and ammonium citrate to remove any organic contaminants from the TCO. The substrate is then exposed to a second cleaning solution, different than the first cleaning solution, and having a pH within a range from about 6 to about 7. The second cleaning solution is agitated to remove any contaminants from the TCO. Each of the cleaning solutions is selected to provide efficient removal of a variety of contaminants. A silicon-containing film is then deposited on the transparent conductive oxide.

In another embodiment, a method of processing a substrate having a TCO disposed thereon comprises exposing the substrate to a first cleaning solution comprising hydrogen peroxide. The first cleaning solution is agitated, and then the substrate is rinsed with deionized water. The substrate is then exposed to a second cleaning solution comprising ammonium citrate or ammonium acetate, and then a silicon-containing film is deposited on the transparent conductive oxide.

In another embodiment, a method of processing a substrate having a TCO disposed thereon comprises exposing the substrate to a first cleaning solution having a pH within a range from about 6 to about 7. The first cleaning solution is agitated, and then substrate is rinsed with deionized water. The substrate is then exposed to a second cleaning solution comprising hydrogen peroxide and rinsed with deionized water. A silicon-containing film is then deposited on the transparent conductive oxide.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to methods for cleaning a substrate prior to a deposition process. The methods generally include exposing a substrate to multiple cleaning solutions to remove contaminants from a surface of a substrate. The multiple solutions generally have different compositions, and each of the solutions contain one or more additives selected to remove a variety of contaminants. Mechanical agitation may also be utilized to remove contaminants from the surface of a substrate. After cleaning a substrate, a material may be deposited on the substrate surface.

Methods described herein are beneficial for processing substrates to be used in photovoltaic modules. Suitable apparatus for performing methods herein include the one or more substrate cleaners of the SunFab™ thin film solar production line available from Applied Materials, Inc. of Santa Clara, Calif. An example of a solar production line is further described in U.S. patent application Ser. No. 12/202,199, filed Aug. 29, 2008, which is herein incorporated by reference. It is contemplated that other commercially available processing lines or stand alone substrate washers may also benefit from methods disclosed herein.

Figure 1A:
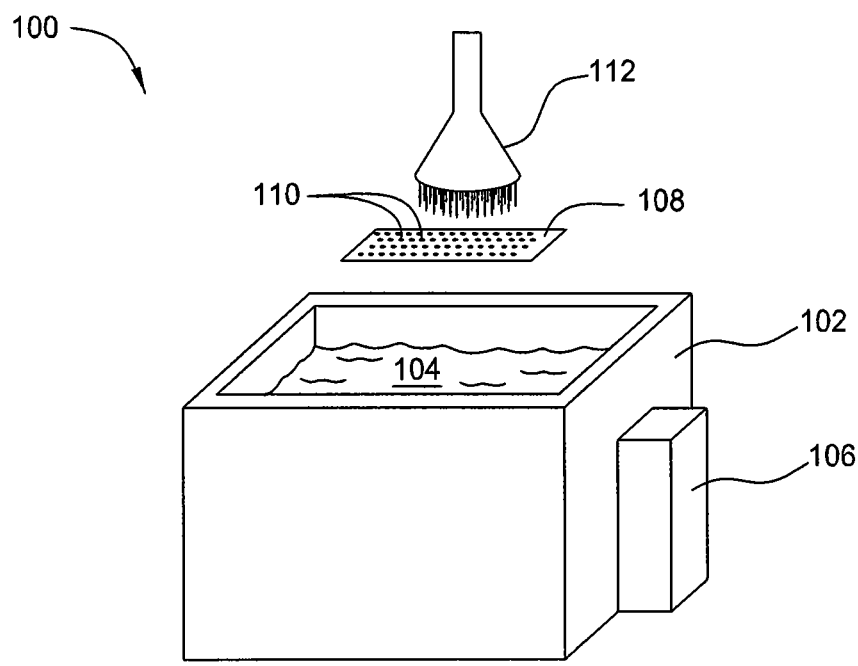
FIG. 1A is a schematic drawing of a single bath washer which may be used to clean a substrate surface.

FIG. 1A is a schematic drawing of a single bath washer 100 which may be used to clean a substrate surface. Washer 100 comprises a cleaning solution 104 disposed in wash tank 102. Coupled to the side of the wash tank 102 is an optional ultrasonic mixer 106 to apply ultrasonic or mechanical agitation to the cleaning solution 104. A substrate 108 may be disposed in the cleaning solution 104 to have contaminants 110 removed therefrom. Substrate 108 generally has a TCO layer disposed thereon. For example, substrate 108 may have a layer of tin-doped indium oxide, aluminum-doped zinc oxide, or indium-doped cadmium oxide disposed thereon.

A sprayer 112 may provide pressurized fluid to remove contaminants from the surface of the substrate 108. Alternatively, the pressurized fluid may be used to remove cleaning solution from the surface of the substrate 108 after removing substrate 108 from the cleaning solution 104. The pressurized fluid supplied from the sprayer 112 may be the same fluid as in cleaning solution 104 or may be deionized water. In the embodiment where sprayer 112 is adapted to provide a rinse solution to the surface of substrate 108, such as deionized water, sprayer 112 may be positioned in a location other than above cleaning solution 104. Thus, a rinse solution could be provided to the surface of substrate 108, and the concentration of the cleaning solution 104 would not be affected by the rinse solution provided by sprayer 112. In one embodiment, multiple washers 100 may be positioned successively to clean a plurality of substrates 108 using an overhead track configuration. Alternatively, a rinse station having a sprayer adapted to provide a rinse solution may be positioned subsequent to a single bath washer.

Figure 1B:
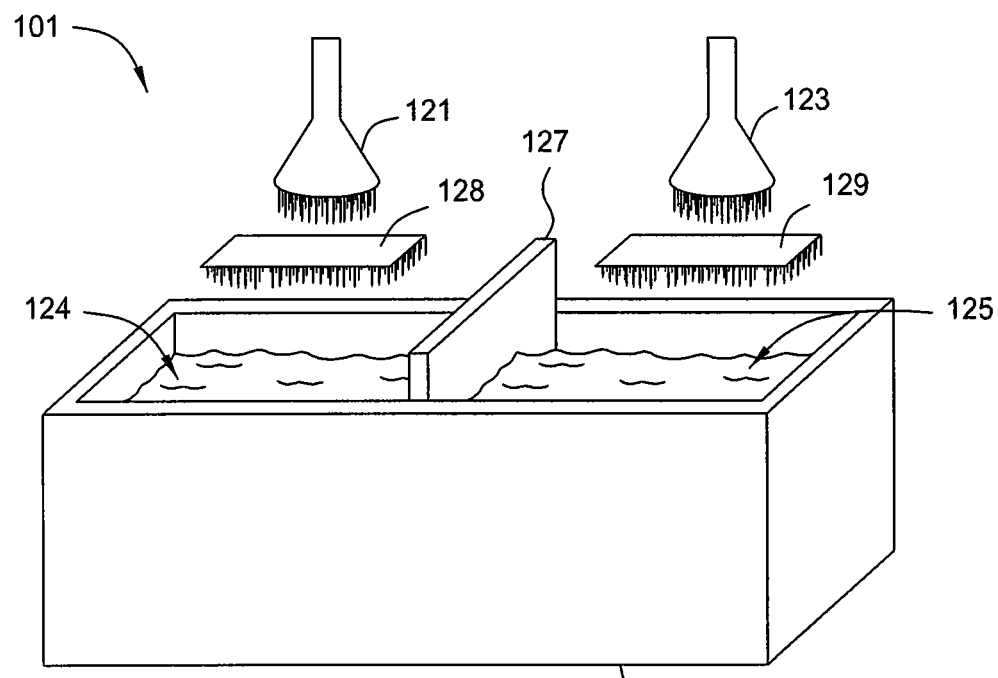
FIG. 1B is a schematic drawing of a dual bath washer which may be used to clean a substrate surface.

FIG. 1B is a schematic drawing of a dual bath washer 101 which may be used to clean a substrate surface. Dual bath washer 101 has a wash tank 122 which is adapted to hold a first cleaning solution 124 and a second cleaning solution 125. A cleaning solution divider 127 is positioned between the first cleaning solution 124 and the second cleaning solution 125 to prevent mixing of the cleaning solutions. Substrates 128 and 129 may be positioned in the first cleaning solution 124 and the second cleaning solution 125, respectively, to remove contaminants present on surfaces of substrates 128 and 129. A first sprayer 121 is positioned above the first cleaning solution 124, while a second sprayer 123 is positioned above a second cleaning solution 125. First sprayer 121 and second sprayer 123 may be used to provide a pre- or post-rinse solution such as deionized water, or may be used to provide pressured cleaning solution to the surface of the substrate 108. In the embodiment where sprayers 121 and 123 are adapted to provide a rinse solution to the surface of substrates 128 and 129, sprayers 121 and 123 may be positioned in a location other than above cleaning solutions 124 and 125. Thus, a rinse solution could be provided to the surface of substrates 128 and 129, and the concentration of the cleaning solutions 124 and 125 would not be affected by the rinse solution provided by sprayers 121 and 123. Alternatively, substrates 128 and 129 may be rinsed in an intermittent rinse bath (not shown) between exposure to the first cleaning solution 124 and the second cleaning solution 125.

Generally, substrates 128 and 129 are sequentially cleaned by first exposing substrate 128 or 129 to the first cleaning solution 124, and then exposing the substrate 128 or 129 to the second cleaning solution 125. However, other cleaning configurations are contemplated. In embodiments where substrates 128 and 129 are sequentially or consecutively cleaned, the first cleaning solution 124 and the second cleaning solution 125 generally have different compositions. In another embodiment, two dual bath washers 101 may be consecutively positioned. In such an embodiment, the first bath of each dual bath washer 101 may be a cleaning solution, while the second bath of each dual bath washer 101 may be a rinse solution. Therefore, during a substrate cleaning processing, a substrate would be exposed to a cleaning solution, a rinse solution, a cleaning solution, and then a final rinse solution, respectively.

Referring to FIG. 1B, the first cleaning solution 124 and the second cleaning solution 125 may be selected to remove specific types of contaminants from the surface of substrates 128 and 129. Contaminants are generally introduced to the surface of substrates 128 and 129 when substrates 128 and 129 are exposed to the ambient environment prior to or between processes. Contaminants may also be introduced to the surface of substrates 128 and 129 during previous substrate processing steps. Different types of contaminants can be targeted and removed using different compositions of cleaning solution. The composition of the first cleaning solution 124 and the second cleaning solution 125 generally include an additive added to a bath of deionized water. Exemplary additives include chelating agents, oxidizing agents, surfactants, and pH-adjusting solutions. Alternatively, the first cleaning solution 124 and the second cleaning solution 125 may comprise an undiluted solution, or a solvent other than deionized water. The first cleaning solution 124 and/or the second cleaning solution 125 may contain any combination of cleaning additives to remove desired contaminants, so long as the combined cleaning additives do not substantially affect the cleaning ability of other additives present in the first or second cleaning solutions.

Embodiments described herein will generally refer to a two bath or two solution cleaning processes. Either of the first cleaning solution or the second cleaning solution may include any of the cleaning additives discussed herein for removal of contaminants, unless specifically stated otherwise. The term "and/or" is used to clarify that the cleaning additives discussed in the following description may be present in the first cleaning solution, or the second cleaning solution, or both the first and second cleaning solutions when necessary to effect a desired level of cleaning. While the first cleaning solution and the second cleaning solution generally have different compositions, it is contemplated that the solutions may have the same compositions when required for sufficient substrate cleaning. In some embodiments, the second cleaning solution may be deionized water used to rinse a substrate previously exposed to a cleaning solution.

In one embodiment, the first cleaning solution 124 and/or the second cleaning solution 125 may be used to remove organic contaminants from the surface of a substrate. The presence of organic contaminants on TCO may prevent the formation of an effective TCO/silicon interface when a silicon layer is subsequently formed on the TCO. The reduced quality of the TCO/silicon interface can result in reduced photovoltaic cell efficiency. Therefore, it is desirable to remove organic contaminants. Organic contaminants can be sufficiently removed from a substrate using oxidizing agents and/or surfactants. Suitable oxidizing agents include peroxides such as hydrogen peroxide, sulfuric acid, or nitric acid. Oxidizing agents may be used in a concentration from about 0.1 percent to about 10 percent by volume in either or both of the first cleaning solution 124 or the second cleaning solution 125. For example, the first cleaning solution 124 may contain about 0.1 percent to about 5 percent hydrogen peroxide by volume in deionized water. Oxidants such as peroxides efficiently remove organic contaminants from the surface of TCO by oxidizing the contaminant.

Surfactants can also be used to remove organic contaminants from a substrate surface. Surfactants remove organic contaminants by forming micelles around the organic contaminants which assist in moving the contaminant from the surface of the substrate to the cleaning solution. Suitable surfactants include sulfates, sulfonates, carboxylates, and polyethylene oxides. Surfactants may be used in the first cleaning solution 124 and/or the second cleaning solution 125 in a concentration between about 0.001 percent and about 5 percent by volume.

In another embodiment, the first cleaning solution 124 and/or the second cleaning solution 125 may be used to remove metal ion contaminants from the surface of a substrate. Metal ions which are present on a substrate before a silicon film is deposited thereon may contaminate the subsequently deposited film, leading to reduced photovoltaic cell efficiency. Metal ions can be removed from a surface of a substrate using chemicals with chelating or complexing capabilities. Chelating agents remove metal ions from a surface of a substrate by forming soluble, complex molecules with the metal ions. The soluble complex molecules reduce the occurrence of the metal ions reacting with other elements and assist in moving the metal ions into the cleaning solution. Suitable chelating agents include ammonium citrate and ammonium acetate, ethylenediaminetetraacetic acid (EDTA), and phosphonates. Chelating agents may be present in the first cleaning solution 124 and/or the second cleaning solution 125 at a concentration of about 0.1 percent to about 10 percent by volume, for example, about 3 percent by volume.

The first cleaning solution 124 and/or the second cleaning solution 125 may also be used to remove particles and particulate contaminants from the surface of a substrate. Particle contaminants may include organic matter or inorganic matter. For example, particle contaminants may include TCO residue generated in a texturing or laser scribing processing. Particle contaminants can be removed from the surface of a substrate by adjusting the pH of the first cleaning solution 124 and/or the second cleaning solution 125 in conjunction with or as an alternative to agitation. The pH of the first cleaning solution 124 or the second cleaning solution 125 is preferably adjusted to within a range from about 4 to about 7, for example about 4 to about 5 or about 6 to about 7. The pH of the first cleaning solution 124 or the second cleaning solution 125 causes the particle contaminants present on the substrate to have approximately the same surface charge as the substrate itself. When the particle contaminants and the substrate have approximately the same charge, the Van der Waals interaction between the two are reduced, allowing the particle contaminants to more easily be washed away or dissolved in cleaning solution.

The pH of the first cleaning solution or the second cleaning solution can be adjusted by adding a pH-adjusting solution to the first cleaning solution 124 and/or the second cleaning solution 125. A pH-adjusting solution is any solution which can be used to adjust the pH of the first or second cleaning solutions, such as an acid or a base. Exemplary bases include potassium hydroxide and ammonium hydroxide. An exemplary acid is hydrochloric acid. Any suitable acid or base which does not adversely affect the substrate or the cleaning ability of other additives present in the first cleaning solution 124 or the second cleaning solution 125 may be used. The molarity of the pH-adjusting solution can be chosen based upon the desired amount of adjustment of the cleaning solution pH.

In addition to adjusting the pH of the first cleaning solution 124 or the second cleaning solution 125, particle contaminants may also be removed with the assistance of ultrasonic or megasonic agitation. The ultrasonic or megasonic agitation may be effected by an ultrasonic or megasonic mixer. Agitation provided by the ultrasonic or megasonic mixer assists in overcoming Van der Waals interactions so that particle contaminants can more easily be separated form a substrate surface. An ultrasonic mixer may be immersed within a cleaning solution bath to provide ultrasonic agitation, or may be coupled to the side of a washer and adapted to provide ultra sonic agitation to a cleaning solution bath. In the embodiment of FIG. 1A, an ultrasonic mixer is coupled to the side of wash tank 102 and adapted to agitate cleaning solution 104.

Prior to or subsequent to exposing a substrate to one or more cleaning solutions 124 or 125, the substrate may also be exposed to an inert gas plasma to remove organic contaminants from a surface of the substrate. For example, a substrate may be exposed to argon plasma for about 30 seconds to about 180 seconds to remove organic contaminants from a surface of a substrate. In one embodiment, a substrate is exposed to an inert gas plasma for about 120 seconds. A substrate may be exposed to an inert gas plasma before the first cleaning solution 124, after the second cleaning solution 125, or intermittently between the first cleaning solution 124 and the second cleaning solution 125.

Figure 2A:
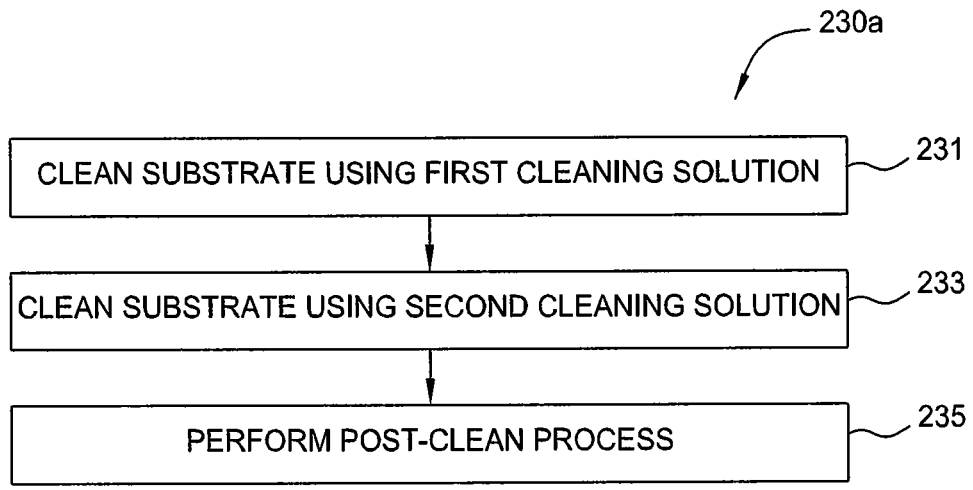
FIG. 2A is a flow diagram illustrating one embodiment of processing a substrate.

FIG. 2A is a flow diagram illustrating one embodiment of processing a substrate. In flow diagram 230a, a substrate is cleaned in step 231 using a first cleaning solution. The first cleaning solution may be disposed in a single bath washer as described in FIG. 1A, or may be disposed in the first bath of a dual bath washer as described in FIG. 1B. The first cleaning solution of step 231 may contain one or more of any of the cleaning additives described herein, so long as the combination of additives does not significantly impair the cleaning ability of other components present in the cleaning solution. For example, the first cleaning solution may be used to remove one or more of inorganic particles, metal ions, or organic contaminants. Generally, step 231 is subsequent to a TCO texturing process, and may be subsequent to a TCO patterning or scribing process. It is preferred, although not necessary, that step 231 follows the texturing and patterning processes in order to remove the contaminants generated thereby.

In step 233, a substrate is transferred from the first cleaning solution to a second cleaning solution. The second cleaning solution may be a bath disposed in a second single bath washer as described in FIG. 1A, or may be a second bath disposed in a dual bath washer as described in FIG. 1B. Alternatively, the first cleaning solution may be drained form a single bath washer and replaced with the second cleaning solution. The second cleaning solution of step 233 is formulated to target and remove specific contaminants not removed in step 231. For example, if inorganic particle contaminants remain on a substrate surface after exposure to the first cleaning solution, then the second cleaning solution may contain an agitated pH-adjusted solution. As described above, pH-adjusted solutions in combination with mechanical agitation effectively remove inorganic particle contaminants present on the surface of a substrate. In step 235, a post-clean process may be performed. In one embodiment, the post-clean process is a film deposition process, such as a plasma-enhanced chemical vapor deposition of amorphous silicon.

Figure 2B:
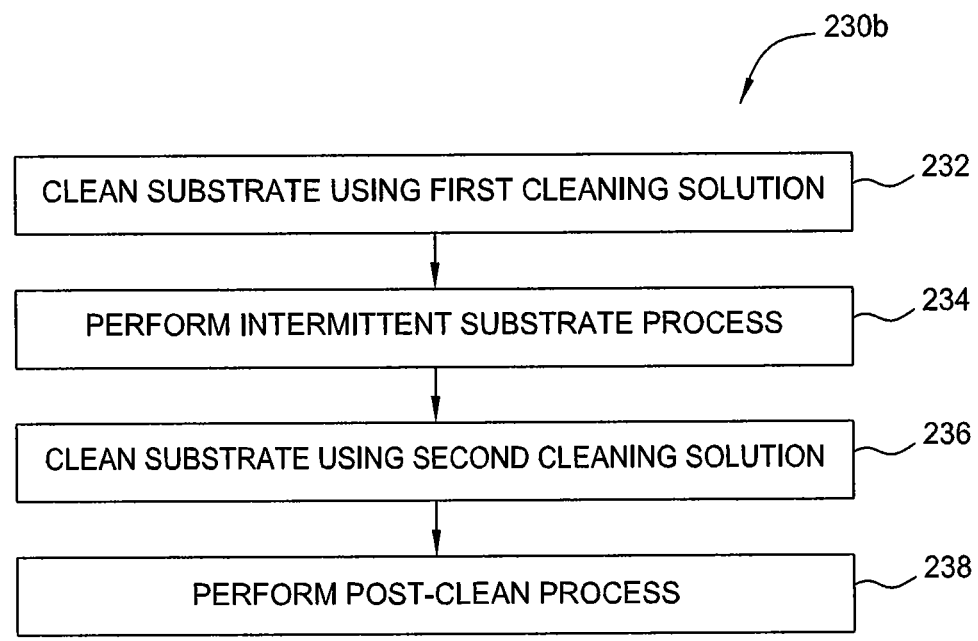
FIG. 2B is a flow diagram illustrating another embodiment of processing a substrate.

FIG. 2B is a flow diagram illustrating another embodiment of processing a substrate. In flow diagram 230b, a substrate is cleaned in step 232 using a first cleaning solution. The first cleaning solution may be disposed in a single bath washer as described in FIG. 1A, or may be the first bath of a dual bath washer as described in FIG. 1B. Generally, step 232 is subsequent to a TCO texturing process. The first cleaning solution of step 232 may contain any combination of the cleaning components or additives described herein. For example, the first cleaning solution may be used to remove one or more of inorganic particles, metal ions, or organic contaminants. Therefore, the first cleaning solution would contain a cleaning additive sufficient to remove the selected or desired contaminant, as described above.

In step 234, an optional intermittent substrate process may be performed. The optional intermittent substrate process may be a laser scribe or laser patterning process. However, since the laser scribe or laser patterning process may generate residue, such as TCO residue, it may be necessary to remove this residue form the substrate after the intermittent substrate process. In step 236, a substrate may be cleaned with a second cleaning solution. If inorganic particles are located on a surface of the substrate, such as TCO residue generated in step 234, then it is desirable to tailor the second cleaning solution to remove the inorganic particles. For example, the second cleaning solution may be an ultrasonically agitated pH-adjusted solution having a pH of about 5. In step 238, a post-clean process, such as a film deposition, may be performed on the substrate. It is preferred that the post-clean process occurs soon after step 236 to avoid the accumulation of extra contaminants on the substrate surface due to extended exposure to the surrounding environment.

TABLE 1

| | PV Cell Efficiency (Percent) | | | | |
|---|---|---|---|---|---|
| | Substrate 1 | Substrate 2 | Substrate 3 | Substrate 4 | Mean |
| Example 1 | 8.46 | 8.41 | 8.09 | N/A | 8.32 |
| Example 2 | 7.85 | 8.29 | 8.51 | N/A | 8.22 |
| Example 3 | 7.14 | 8.30 | 7.86 | N/A | 7.77 |
| Example 4 | 7.19 | 7.34 | 7.74 | 6.42 | 7.17 |
| Example 5 | 7.53 | 8.33 | 7.65 | N/A | 7.84 |
| Example 6 | 6.42 | 5.87 | 7.86 | 6.72 | 6.72 |
| Example 7 | 8.57 | 7.83 | 8.55 | N/A | 8.32 |

Table 1 illustrates the efficiency of photovoltaic cells manufactured from substrates cleaned by methods described herein. Referring to Example 1 of Table 1, a first cleaning solution containing deionized water with 3 percent hydrogen peroxide by volume is used to clean three 30 centimeter by 30 centimeter substrates. The three substrates were then rinsed with a second solution of deionized water. After forming photovoltaic cells with the cleaned substrates, the photovoltaic cells had a mean conversion efficiency of 8.32 percent. The individual photovoltaic cells had efficiencies of 8.46 percent, 8.41 percent and 8.09 percent, respectively. The mean conversion efficiency of Example 1 represents about a 24 percent increase in conversion efficiency when compared to standard cleaning techniques.

In Example 2, a two solution process was used to clean three 30 centimeter by 30 centimeter substrates. The first solution contained one percent ammonium citrate by volume in deionized water. A second solution contained about 96 percent isopropyl alcohol by volume in deionized water. The three substrates cleaned in Example 2 were used to form photovoltaic cells which had a mean conversion efficiency of 8.22 percent after processing. The individual photovoltaic cells had efficiencies of 7.85 percent, 8.29 percent, and 8.51 percent, respectively. As an alternative to the second solution, isopropyl alcohol wipes containing substantially pure isopropyl alcohol could be used to clean the substrate surfaces.

In example 3, three 30 centimeter by 30 centimeter substrates were cleaned with a first cleaning solution containing one percent ammonium citrate by volume in deionized water. The substrates were then cleaned with a second cleaning solution containing 96 percent isopropyl alcohol by volume, and then exposed to argon plasma for about 120 seconds. The three substrates processed in Example 3 were used to form photovoltaic cells which had a mean conversion efficiency of 7.77 percent. The individual photovoltaic cells had efficiencies of 7.14, 8.30, and 7.86, respectively.

In Example 4, four substrates were cleaned in a first cleaning solution of one percent ammonium carbonate by volume. The four substrates were then rinsed with a second solution of deionized water. The four substrates of Example 4 were used to form photovoltaic cells which had a mean conversion efficiency of 7.17 percent. The individual photovoltaic cells had efficiencies of 7.19 percent, 7.34 percent, 7.74 percent, and 6.42 percent, respectively.

In Example 5, three 30 centimeter by 30 centimeter substrates were cleaned with a first cleaning solution of one percent ammonium citrate by volume. The three substrates were then rinsed with a second solution of deionized water. The three substrates cleaned with the cleaning solution of one percent ammonium citrate and subsequently rinsed with deionized water were used to form photovoltaic cells which had a mean conversion efficiency of 7.84 percent. The individual photovoltaic cells had efficiencies of 7.53 percent, 8.33 percent, and 7.65 percent, respectively. In Example 6, a first cleaning solution comprising potassium hydroxide, sodium silicate, and sodium perchlorate with a pH of about 10-12 was used to clean four substrates. The four substrates were then rinsed with deionized water. The four substrates of Example 6 were used to form photovoltaic cells which had a mean conversion efficiency of 6.72 percent. The individual photovoltaic cells had efficiencies of 6.42 percent, 5.87 percent, 7.86 percent, and 6.72 percent, respectively.

In Example 7, three 30 centimeter by 30 centimeter substrates were cleaned with a first cleaning solution of about 96 percent isopropyl alcohol by volume. The three substrates were then rinsed with deionized water. The three substrates of Example 7 were used to form photovoltaic cells having a mean conversion efficiency of 8.32 percent. The individual photovoltaic cells had efficiencies of 8.57 percent, 7.83 percent, and 8.55 percent. Having approximately 15 percent light induced degradation, the average final stabilized conversion efficiency of a single junction module manufactured with the substrates of Example 7 was about 7 percent. With 20 percent light induced degradation, the average final stabilized conversion efficiency of a single junction module manufactured with the substrates of Example 7 was about 6.6 percent.

TABLE 2

| | Washer 1 | | Washer 2 | |
|---|---|---|---|---|
| | Cleaning Solution | Contaminant Removed | Cleaning Solution | Contaminant Removed |
| Example 8 | pH-adjusting solution and agitation | Organic and inorganic particles | Peroxide | Organic |
| Example 9 | Peroxide | Organic | pH-adjusting solution and agitation | Organic and inorganic particles |
| Example 10 | Peroxide and agitation | Organic and inorganic particles | Chelating Agents | Metal ions |
| Example 11 | Chelating Agents | Metal ions | Peroxide and agitation | Organic and inorganic particles |
| Example 12 | Peroxide, chelating agents and agitation | Organic and inorganic particles, metal ions | Deionized water | Organic and inorganic particles, rinse |
| Example 13 | Deionized water | Organic and inorganic particles | Peroxide, chelating agents and agitation | Organic and inorganic particles, metal ions |

Table 2 illustrates some embodiments for cleaning substrates. The embodiments shown in Table 2 are provided to illustrate some of the possible combinations and compositions of first and second cleaning solutions for use in a dual bath washer. The cleaning solutions discussed in the embodiments of Table 2 may be provided in the concentrations detailed above. Other combinations and compositions of first and second cleaning solutions are possible, and may be dictated by the types of contaminants desired to be removed.

In Example 8, a first washer has a cleaning solution comprising a pH-adjusted solution. The cleaning solution of the first washer is agitated to remove organic and inorganic particles. A cleaning solution in a second washer comprises peroxide to remove remaining organic contaminants. Although not shown, Washer 1 or Washer 2 may additionally contain ammonium citrate to remove metal ions. In Example 9, Washer 1 contains peroxide to remove organic material, and Washer 2 contains an agitated pH-adjusted solution to remove organic and inorganic particles. Additionally, although not shown, a chelating agent may be added to Washer 1 or Washer 2 to remove metal ions form a substrate surface.

In the embodiment of Example 10, Washer 1 contains agitated peroxide to remove organic and inorganic particles. Washer 2 contains a chelating agent to remove metal ions. In Example 11, Washer 1 contains chelating agents to remove metal ions. Washer 2 contains agitated peroxide to subsequently remove organic and inorganic particles from a substrate surface. In Example 12, Washer 1 contains agitated peroxide and chelating agents to remove organic and inorganic particles as well as metal ions. Washer 2 contains deionized water to remove any remaining particles and to rinse the substrate. In example 12, Washer 1 contains deionized water to remove particles, while Washer 2 contains agitated peroxide and chelating agents to remove organic and inorganic particles as well as metal ions.

As described above, the use of targeted chemistries to remove specific types of contaminants from the surface of substrates allows for more effective cleaning of substrate surfaces. Cleaner substrate surfaces allow for higher conversion efficiencies to be obtained from processed photovoltaic modules. Additionally, the use of a multiple bath system allows for individual baths to be formulated to remove targeted contaminants. The specifically formulated cleaning solutions allow for more effective removal of contaminants since the cleaning solutions can be designed to remove specific contaminants. The cleaner surfaces and higher conversion efficiencies of the processed substrates reduce the cost per unit energy of manufactured photovoltaic modules.

While the foregoing is directed to embodiments of the present invention, other and further embodiments of the invention may be devised without departing from the basic scope thereof, and the scope thereof is determined by the claims that follow.

We claim:

1. A method of processing a substrate having a transparent conductive oxide disposed thereon, comprising:
    exposing the substrate to a first cleaning solution comprising hydrogen peroxide and ammonium citrate;
    exposing the substrate to a second cleaning solution having a pH within a range from about 6 to about 7, the second cleaning solution different than the first cleaning solution;
    agitating the second cleaning solution; and
    depositing a silicon-containing film on the transparent conductive oxide.

2. The method of claim 1, further comprising scribing the surface of the substrate with a laser prior to the exposing the substrate to a second cleaning solution.

3. The method of claim 2, wherein the agitating the second cleaning solution comprises removing particles of transparent conductive oxide from a surface of the substrate.

4. The method of claim 3, wherein the agitating the second cleaning solution utilizes an ultrasonic mixer.

5. The method of claim 4, wherein the second cleaning solution contains one or more compounds selected from the group consisting of potassium hydroxide, ammonium hydroxide, and hydrochloric acid.

6. The method of claim 1, further comprising exposing the substrate to a first rinse solution after the exposing the substrate to a first cleaning solution and before the exposing the substrate to a second cleaning solution.

7. The method of claim 6, wherein the rinse solution is deionized water.

8. The method of claim 7, further comprising exposing the substrate a second rinse solution after agitating the second cleaning solution.

* * * * *